United States Patent [19]

Auyeung

[11] Patent Number: 5,473,376
[45] Date of Patent: Dec. 5, 1995

[54] METHOD AND APPARATUS FOR ADAPTIVE ENTROPY ENCODING/DECODING OF QUANTIZED TRANSFORM COEFFICIENTS IN A VIDEO COMPRESSION SYSTEM

[75] Inventor: Cheung Auyeung, Hoffman Estates, Ill.

[73] Assignee: Motorola, Inc., Schaumburg, Ill.

[21] Appl. No.: 347,639

[22] Filed: Dec. 1, 1994

[51] Int. Cl.$^6$ .................................. H04N 7/26; H04N 7/30
[52] U.S. Cl. ........................ 348/403; 348/405; 348/404; 348/419; 348/420
[58] Field of Search ..................................... 348/384, 395, 348/403, 405, 395, 404, 419, 420

[56] References Cited

U.S. PATENT DOCUMENTS

| | | | |
|---|---|---|---|
| 4,633,296 | 12/1986 | Cham et al. | 348/403 |
| 5,038,209 | 8/1991 | Hang | 348/420 |
| 5,162,908 | 11/1992 | Kim | 348/403 |
| 5,253,055 | 10/1993 | Civanlar et al. | 348/419 |
| 5,272,528 | 12/1993 | Juri et al. | 348/403 |
| 5,282,031 | 1/1994 | Kim | 348/404 |
| 5,371,549 | 12/1994 | Park | 348/403 |
| 5,396,291 | 3/1995 | Sanpei | 348/403 |

OTHER PUBLICATIONS

"Coding of Moving Pictures and Associated Audio–For Digital Storage Media at up to about 1.5 Mbit/s–", CD 11172–2, Part 2 Video, Apr. 3, 1992.

"Video Codec Test Model, TMN4", ITU Telecommunicaton Standardization Sector, Study Group 15, Working Party 15/1, LBC–94.

Primary Examiner—Tommy P. Chin
Assistant Examiner—Anand S. Rao
Attorney, Agent, or Firm—Darleen J. Stockley

[57] ABSTRACT

The present invention is a method (100) and apparatus (300) for adaptive entropy encoding/decoding of a plurality of quantised transform coefficients in a video/image compression system. For encoding, first, a predetermined number of quantized transform coefficients are received in a predetermined order, giving a generally decreasing average power. Then the quantized transform coefficients are parsed into a plurality of coefficient groups. When the last coefficient group comprises all zero quantized coefficients, it is discarded. The coefficient groups are then converted into a plurality of parameter sets in the predetermined order. A current parameter set is obtained from the parameter sets in the reverse order of the predetermined order. A current entropy encoder is selected adaptively based on the previously selected entropy encoder and the previous parameter set. The current parameter set is encoded by the current entropy encoder to provide entropy encoded information bits.

18 Claims, 3 Drawing Sheets

100

102 — PARSING A PREDETERMINED NUMBER OF QUANTIZED TRANSFORM COEFFICIENTS INTO A PLURALITY OF COEFFICIENT GROUPS AND CONVERTING THE COEFFICIENT GROUPS INTO A PLURALITY OF PARAMETER SETS ACCORDING TO A PREDETERMINED SCHEME AND STORING THE PARAMETER SETS IN THE MEMORY UNIT, WHEREIN EACH PARAMETER SET INCLUDES A LEVEL PARAMETER WHICH IS A VALUE OF A NON ZERO QUANTIZED TRANSFORM COEFFICIENT, WHEREIN, WHERE A LAST COEFFICIENT GROUP COMPRISES ALL ZERO QUANTIZED TRANSFORM COEFFICIENTS, THE LAST COEFFICIENT GROUP IS DISCARDED

↓

104 — ACESSING, FROM THE MEMORY UNIT, EACH PARAMETER SET OF THE PLURALITY OF PARAMETER SETS IN A REVERSE ORDER OF THE PREDETERMINED SCANNING ORDER

↓

106 — ADAPTIVELY SELECTING A CURRENT ENTROPY ENCODER OF A PLURALITY OF ENTROPY ENCODERS BASED ON A PREVIOUS LEVEL PARAMETER OF A PREVIOUS PARAMETER SET AND A PREVIOUSLY SELECTED ENTROPY ENCODER

↓

108 — ENCODING, BY THE CURRENT ENTROPY ENCODER, A CURRENT PARAMETER SET TO PROVIDE ENTROPY ENCODED INFORMATION BITS

202 — DECODING, BY A CURRENT ENTROPY DECODER, THE ENTROPY ENCODED INFORMATION BITS TO PROVIDE A DECODED CURRENT PARAMETER SET

↓

204 — ADAPTIVELY SELECTING A NEXT ENTROPY DECODER OF A PLURALITY OF ENTROPY DECODERS BASED ON A DECODED CURRENT LEVEL PARAMETER OF THE DECODED CURRENT PARAMETER SET AND A PREVIOUSLY SELECTED ENTROPY DECODER

↓

206 — STORING, INTO THE MEMORY UNIT, EACH PARAMETER SET OF A PLURALITY OF DECODED PARAMETER SETS IN THE REVERSE ORDER OF THE PREDETERMINED SCANNING ORDER

↓

208 — CONVERTING THE DECODED PARAMETER SETS INTO A NUMBER OF DECODED QUANTIZED TRANSFORM COEFFICIENTS ACCORDING TO THE PREDETERMINED SCHEME IN THE PREDETERMINED SCANNING ORDER AND STORING THE DECODED QUANTIZED TRANSFORM COEFFICIENTS IN THE MEMORY UNIT, WHEREIN, WHERE THE NUMBER OF DECODED QUANTZED TRANSFORM COEFFICIENTS IS LESS THEN THE PREDETERMINED NUMBER OF QUANTIZED TRANSFORM COEFFICIENTS, ZERO VALUED DECODED QUANTIZED TRANSFORM COEFFICIENTS WILL BE APPENDED

*Fig.2*

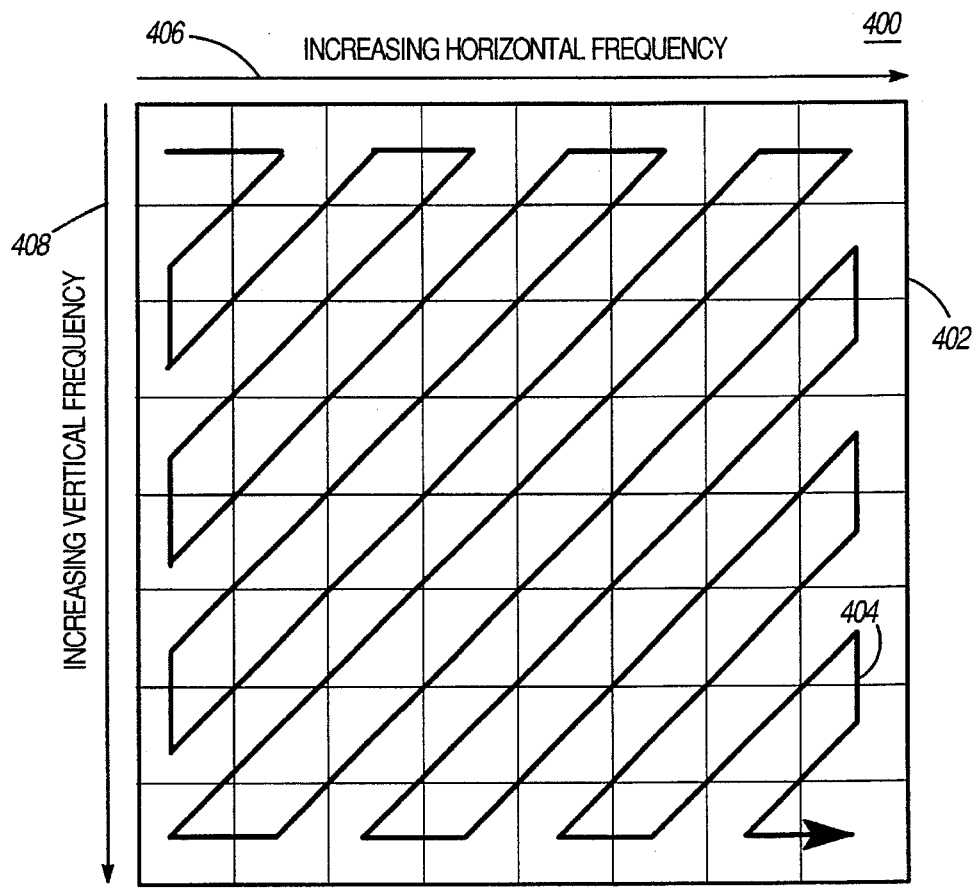
*Fig.4*  — PRIOR ART —
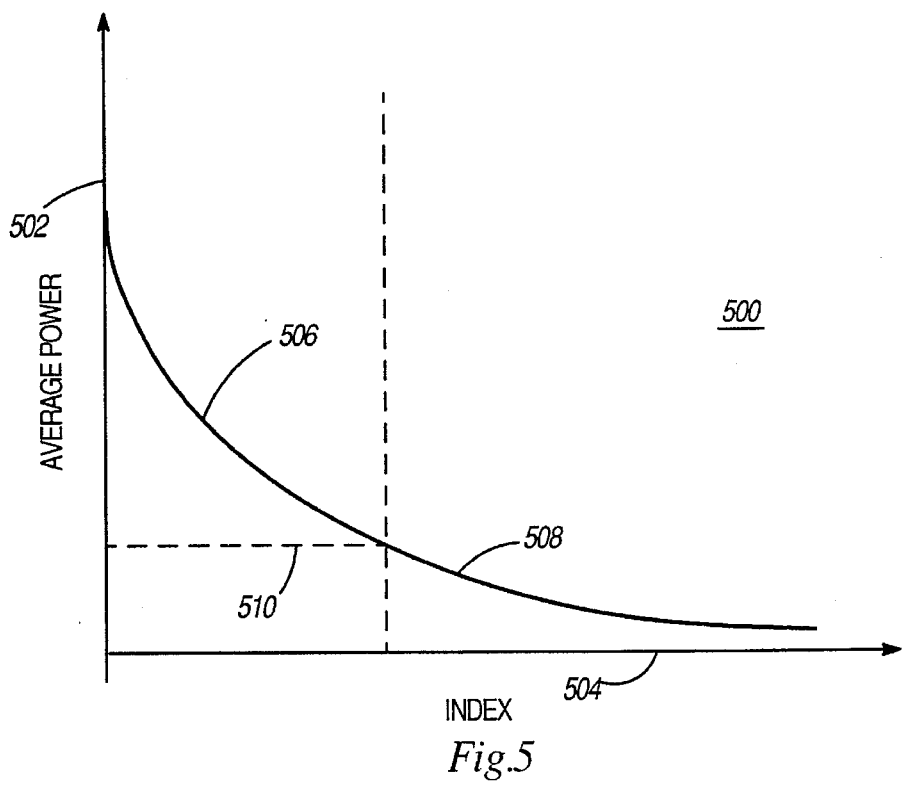
*Fig.5*

METHOD AND APPARATUS FOR ADAPTIVE ENTROPY ENCODING/DECODING OF QUANTIZED TRANSFORM COEFFICIENTS IN A VIDEO COMPRESSION SYSTEM

BACKGROUND OF THE INVENTION

1. Field of the Invention

The invention relates generally to the field of video compression, and in particular, to entropy coding.

2. Description of the Prior Art

Video systems are known to include a plurality of communication devices and communication channels, which provide the communication medium for the communication devices. For example, the communication channel may be wireline connections or radio frequency, RF, carriers. To increase the efficiency of the video system, video that needs to be communicated over the communication medium is digitally compressed. Digital compression reduces the number of bits needed to represent the video while maintaining perceptual quality of the video. The reduction in bits allows more efficient use of channel bandwidth and reduces storage requirements. To achieve digital video compression, each communication device may include an encoder and a decoder. The encoder allows a communication device to compress video before transmission over a communication channel. The decoder enables the communication device to receive compressed video from a communication channel and render it visible. Communication devices that may use digital video compression include high definition television transmitters and receivers, cable television transmitters and receivers, video telephones, computers and portable radios.

Several emerging standards for digital video compression are being developed, including International Telecommunications Union (ITU), ITU-T Recommendation H.26P, the International Standards Organization/International Electrotechnical Committee (ISO/IEC), and International Standard MPEG-4. These standards are likely to use transform coding as part of the building blocks for good coding efficiency. Currently, the Expert's Group on Very Low Bitrate Visual Telephony, LBC, is considering using the discrete cosine transform for coding efficiency. The Moving Pictures Expert's Group, MPEG, is also likely to use the discrete cosine transform or other type of transform. To achieve compression, the transform coefficients are quantized and entropy coded.

Therefore, to maximize the compression capability, a need exists for a method and apparatus for entropy coding the quantized transform coefficients more efficiently than the emerged standard H.261, MPEG-1, and MPEG-2, especially for low bit rate applications.

SUMMARY OF THE INVENTION

The present invention is a method and apparatus for adaptive entropy encoding/decoding of a plurality of quantized transform coefficients in a video/image compression system. For encoding, first, a predetermined number of quantized transform coefficients are received in a predetermined order, giving a generally decreasing average power. Then the quantized transform coefficients are parsed into a plurality of coefficient groups. When the last coefficient group comprises all zero quantized coefficients, it is discarded. The coefficient groups are then converted into a plurality of parameter sets in the predetermined order. A current parameter set is obtained from the parameter sets in the reverse order of the predetermined order. A current entropy encoder is selected adaptively based on the previously selected entropy encoder and the previous parameter set. The current parameter set is encoded by the current entropy encoder to provide entropy encoded information bits.

BRIEF DESCRIPTION OF THE DRAWINGS

FIG. 1 is a flow diagram of steps for one embodiment of a method for adaptive entropy encoding in accordance with the present invention.

FIG. 2 is a flow diagram of steps for one embodiment of a method for adaptive entropy decoding in accordance with the present invention.

FIG. 4 is an exemplary prior art illustration of a method of scanning and transforming a two dimensional block to provide a one dimensional array of scanned coefficients.

FIG. 5 is a graphical depiction of the average power, in general, of the scanned coefficients with respect to the index; a distinction between lower and higher power coefficient is made in accordance with the present invention.

DESCRIPTION OF A PREFERRED EMBODIMENT

Figure 3:
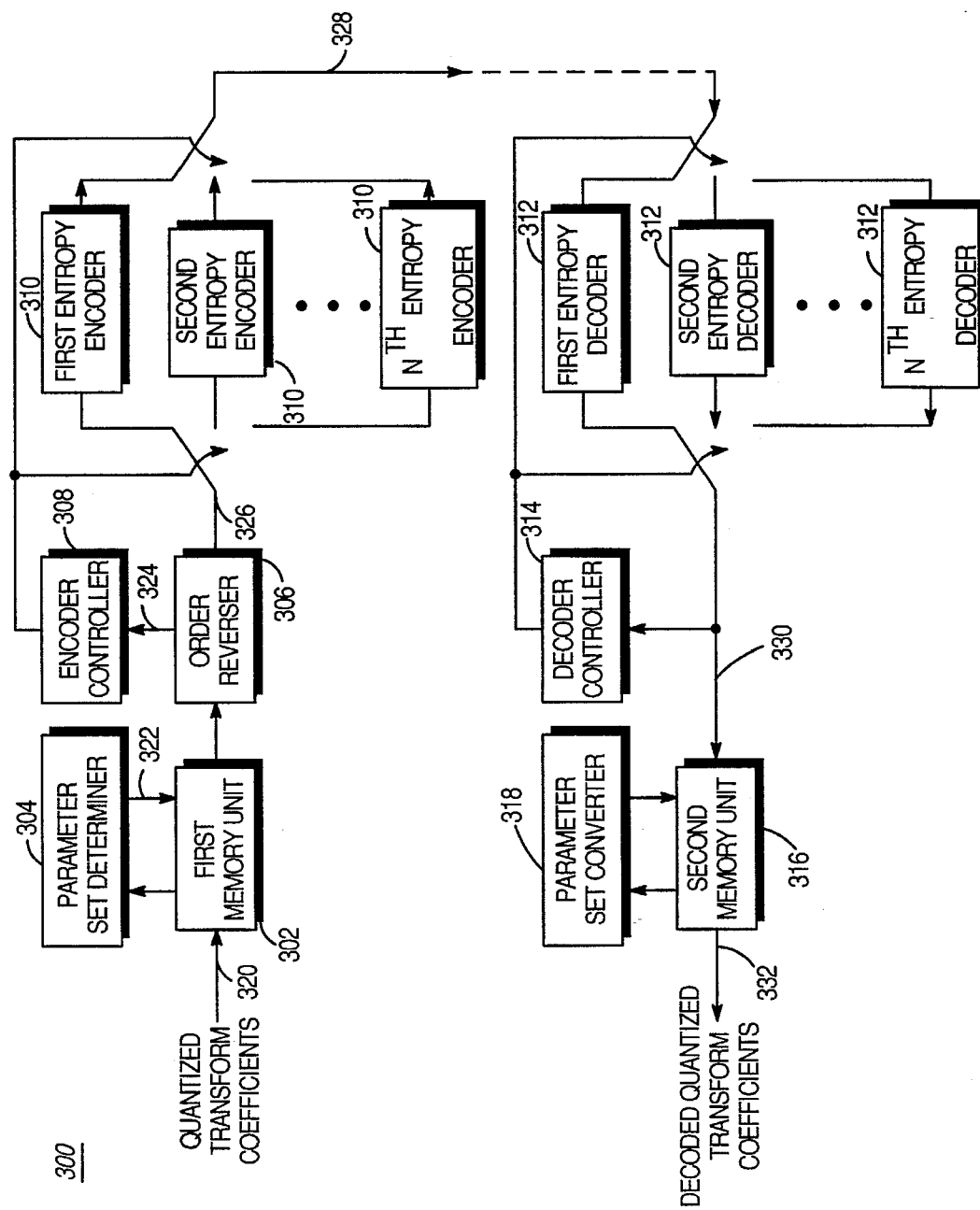
FIG. 3 is a block diagram of one embodiment of an apparatus for adaptive entropy encoding/decoding in accordance with the present invention.

The present invention is a method and an apparatus for adaptive entropy encoding/decoding of a plurality of quantized transform coefficients in a video/image compression system. For encoding, first, a predetermined number of quantized transform coefficients are received in a predetermined order giving a generally decreasing average power. Then the quantized transform coefficients are parsed into a plurality of coefficient groups. When a last coefficient group comprises all zero quantized coefficients, the last coefficient group is discarded. The coefficient groups are then converted into a plurality of parameter sets in the predetermined order. A current parameter set is obtained from the parameter sets in the reverse order of the predetermined order. A current entropy encoder is selected adaptively based on the previously selected entropy encoder and the previous parameter set. The current parameter set is encoded by the current entropy encoder to provide entropy encoded information bits.

This invention may be used with a compression algorithm that processes a picture into two-dimensional blocks of quantized transform coefficients with predetermined transform sizes. Each block is then scanned into a one-dimensional array in a predetermined order giving generally decreasing average power.

The one-dimensional array of quantized transform coefficients are parsed into a sequence of coefficient groups as shown by the following example. For example, consider an array having 64 coefficients, only five of which are non-zero:

$$\{0,0,1,0,-2,3,0,1,0,0,1,0,0,\ldots\} \tag{1}$$

After parsing, the coefficient groups are $$\{0,0,1\},\{0,-2\},\{3\},\{0,1\},\{0,0,1\}. \tag{2}$$

In general, the number of coefficient groups is the same as the number of non-zero coefficients since the last group {0, 0, ... }, which consists of all zero coefficients, is discarded. Each coefficient group has the form $$\{0,\ldots,0,1\} \tag{3}$$

which consists of a sequence of zero coefficients followed by a non-zero coefficient. The coefficient groups are also ordered in the same manner as the coefficients.

Each coefficient group $\{0, \ldots, 0,1\}$ is then converted into a parameter set $$\{r,l,e\} \tag{4}$$

where r is the run, which may be equal to zero, defined as the number of zero coefficients in the coefficient group, l is the level, and e is the end-of-block indicator which indicates whether the parameter set is the first set of the coefficient groups. Thus, where the parameter set is the first set of the coefficient groups, e is set to one, and where the parameter set is other than the first set of coefficient groups, e is set to zero. For example, the coefficient group $\{0, 0, 1\}$ becomes the parameter set $\{2, 1, 1\}$, and the coefficient group $\{3\}$ becomes the parameter set $\{0, 3, 0\}$.

The present invention can be more fully described with reference to FIGS. 1–4. FIG. 1, numeral 100, is a flow diagram of steps for one embodiment of a method for adaptive entropy encoding in accordance with the present invention. A plurality of quantized transform coefficients are scanned in a predetermined scanning order giving a generally decreasing average power and the plurality of quantized transform coefficients are stored in a memory unit. The first step in the encoding method is parsing a predetermined number of quantized transform coefficients into a plurality of coefficient groups and converting the coefficient groups into a plurality of parameter sets according to a predetermined scheme and storing the parameter sets in the memory unit (102). Each parameter set includes a level parameter which is a value of a non zero quantized transform coefficient. When a last coefficient group comprises all zero quantized transform coefficients, the last coefficient group is discarded. The second step in the encoding method is accessing, from the memory unit, each parameter set of the plurality of parameter sets in a reverse order of the predetermined scanning order (104). The third step in the encoding method is adaptively selecting a current entropy encoder of a plurality of entropy encoders based on a previous level parameter of a previous parameter set and a previously selected entropy encoder (106). The fourth and final step in the encoding method is encoding, by the current entropy encoder, a current parameter set to provide entropy encoded information bits (108). The parameter sets and stored in the memory unit in the form $\{r,l,e\}$. The encoding process is repeated until the end-of-block parameter of the final parameter set indicates that the current parameter set is the last parameter set to be encoded.

FIG. 2, numeral 200, is a flow diagram of steps for one embodiment of a method for adaptive entropy decoding in accordance with the present invention. The first step in the decoding method is decoding, by a current entropy decoder, the entropy encoded information bits to provide a decoded current parameter set (202). The second step in the decoding method is adaptively selecting a next entropy decoder of a plurality of entropy decoders based on a decoded current level parameter of the decoded current parameter set and a previously selected entropy decoder (204). The third step in the decoding method is storing, into the memory unit, each parameter set of a plurality of decoded parameter sets in the reverse order of the predetermined scanning order (206).

The fourth and final step in the decoding method is converting the decoded parameter sets into a number of decoded quantized transform coefficients according to the predetermined scheme in the predetermined scanning order and storing the decoded quantized transform coefficients in the memory unit (208). Where the number of decoded quantized transform coefficients is less than the predetermined number of quantized transform coefficients, zero-valued decoded quantized transform coefficients will be appended. The decoding process is repeated until the end-of-block parameter of the current parameter set indicates that the current parameter set is the last parameter set to be decoded.

The current entropy encoder for encoding the current parameter set is adaptively chosen from a sequence of entropy encoders, and the current entropy decoder for decoding the entropy encoded information bits is adaptively chosen from a sequence of entropy decoders corresponding to the sequence of entropy encoders. The entropy encoders/decoders can be based on variable length codes or arithmetic codes. Let $n \geq 2$, and $E_1, E_2, \ldots, E_n$ be a sequence of entropy encoders/decoders, and $T_1, T_2, \ldots, T_{n-1}$ be the corresponding sequence of positive thresholds of increasing magnitude. The sequence of entropy encoders/decoders is arranged in the order of ability to code increasing levels. A more efficient coding scheme for a particular encoder/decoder is selected based on the information that the levels to be coded by the particular encoder/decoder do not exceed a corresponding threshold. When n=2, a preferred $T_1$ is one for the emerging H.26P standard. The adaptation is performed as follows.

Initially, $E_1$ is used to encode/decode the first parameter set. Let $E_{k-1}$ be the entropy encoder/decoder used to encode/decode the previous parameter set, (r, l, e). If $|l|>T_{k-1}$, then $E_k$ is used to encode/decode the current parameter set, otherwise $E_{k-1}$ is used to encode/decode the current parameter set.

FIG. 3, numeral 300, is a block diagram of an apparatus for adaptive entropy encoding/decoding in accordance with the present invention. The apparatus comprises a first memory unit (302), a parameter set determiner (304), an order reverser (306), an encoder controller (308), and a plurality of entropy encoders (310). When decoding is performed, the apparatus further comprises a plurality of entropy decoders (312), a decoder controller (314), a second memory unit (316), and a parameter set converter (318).

For encoding, the quantized transform coefficients (320) are received and stored in the first memory unit (302). The parameter set determiner (304) accesses the quantized coefficients in the memory unit (302). The parameter set determiner (304) parses and converts the quantized transform coefficients (320) into a plurality of parameter sets (322) in a predetermined order of generally increasing average power and stores the parameter sets in the memory unit (302). The order reverser (306) accesses the parameter sets (322) in the memory unit (302) in the reverse order of the predetermined order. The order reverser (306) sends the level of the current parameter set (324) to the encoder controller (308). The encoder controller (308) adaptively selects a current entropy encoder from the plurality of entropy encoder (310) based on the previous entropy encoder and the previous level. The encoder controller (308) then switches the current parameter set (326) to the current entropy encoder and switches the output of the current entropy encoder to form the entropy encoded information bits (328).

For decoding, the decoder controller (314) switches the entropy encoded information bits (328) to the current entropy decoder in the plurality of entropy decoders (312). The current entropy decoder decodes the entropy encoded information bits (328) and generates the current decoded parameter set (330). The decoder controller (314) then adaptively selects the next entropy decoder from the plurality of entropy decoders (312), corresponding to the set of entropy encoders (310), based on the current entropy decoder and the current level of the current decoded parameter set (330). The current parameter set (330) is stored in a second memory unit (316). The parameter set converter (378) accesses the second memory unit (316) to convert the parameter sets back into quantized transform coefficients and store the quantized transform coefficients in the second memory unit (316). The decoded quantized transform coefficients (332) are then output from the second memory unit (316).

The present invention is based on the observation that the quantized transform coefficients scanned in the order of decreasing average power have different amount of average power in different locations of the scan. Therefore different entropy encoders should be used adaptively to code the quantized transform coefficients in different location of the scan.

FIG. 4, numeral 400, is an exemplary prior art illustration of a method of scanning and transforming a two dimensional block to provide a one dimensional array of scanned coefficients. A two-dimensional block of 64 quantized discrete cosine transform coefficients is illustrated by the two-dimensional grid (402) in increasing horizontal frequency (406) from left to right and in increasing vertical frequency (408) from top to bottom. The quantized transform coefficients are scanned in a zig-zag order (404) as described in the MPEG-1 and H.261 standard to form a one-dimensional array of 64 quantized coefficients.

FIG. 5, numeral 500, is a graphical depiction of the average power, in general, of the scanned coefficients, where the graph of the average power of the scanned coefficients is separated into higher (506) and lower (508) power coefficient groupings. A distinction between lower and higher power coefficient is made in accordance with the present invention. In general the average power (502) of the zig-zag scanned coefficients in 400 decreases as a function of its index (504). The index is defined as the order in which a coefficient was scanned. In this example, the zig-zag scanned coefficient are divided into the higher power coefficients (506), and the lower power coefficients (508) by a threshold (510). Because of different statistical properties of the higher power coefficients (506) and the lower power coefficients (508), one entropy encoder is used to code the higher power coefficients (506), and another entropy encoder is used to code the lower power coefficients (508).

The present invention codes the quantized transform coefficients with less number of bits than the coding method used in MPEG-1, MPEG-2, and H.261. The present invention adapts to each block of quantized transform coefficients while the coding method in MPEG-1, MPEG-2, and H.261 does not.

I claim:

1. A method for adaptive entropy encoding/decoding of a plurality of quantized transform coefficients in a video compression system, wherein the plurality of quantized transform coefficients are scanned in a predetermined scanning order giving a generally decreasing average power and the plurality of quantized transform coefficients are stored in a memory unit, the method comprising at least one of:

A) encoding by:
   A1) parsing a predetermined number of quantized transform coefficients into a plurality of coefficient groups and converting the coefficient groups into a plurality of parameter sets according to a predetermined scheme and storing the parameter sets in the memory unit, wherein each parameter set includes a level parameter which is a value of a non zero quantized transform coefficient, wherein, where a last coefficient group comprises all zero quantized transform coefficients, the last coefficient group is discarded;
   A2) accessing, from the memory unit, each parameter set of the plurality of parameter sets in a reverse order of the predetermined scanning order;
   A3) adaptively selecting a current entropy encoder of a plurality of entropy encoders based on a previous level parameter of a previous parameter set and a previously selected entropy encoder; and
   A4) encoding, by the current entropy encoder, a current parameter set to provide entropy encoded information bits; and B) decoding by:
   B1) decoding, by a current entropy decoder, the entropy encoded information bits to provide a decoded current parameter set;
   B2) adaptively selecting a next entropy decoder of a plurality of entropy decoders based on a decoded current level parameter of the decoded current parameter set and a previously selected entropy decoder;
   B3) storing, into the memory unit, each parameter set of a plurality of decoded parameter sets in the reverse order of the predetermined scanning order; and
   B4) converting the decoded parameter sets into a number of decoded quantized transform coefficients according to the predetermined scheme in the predetermined scanning order and storing the decoded quantized transform coefficients in the memory unit, wherein, where the number of decoded quantized transform coefficients is less than the predetermined number of quantized transform coefficients, zero-valued decoded quantized transform coefficients will be appended.

2. The method of claim 1 wherein the predetermined scheme forms coefficient groups by grouping consecutive zero-valued quantized transform coefficients up to and including a non-zero quantized transform coefficient.

3. The method of claim 1, wherein each parameter set further comprises an end-of-block parameter which signifies a final parameter set to be encoded in the plurality of parameter sets.

4. The method of claim 1, wherein each entropy encoder is a variable length encoder.

5. The method of claim 1, wherein each entropy encoder is an arithmetic encoder.

6. The method of claim 1, wherein the plurality of entropy encoders are in a predetermined order.

7. The method of claim 1, wherein the plurality of entropy encoders is two entropy encoders.

8. The method of claim 2, wherein each parameter set further comprises a run parameter which is a number of consecutive zero-valued quantized transform coefficients prior to the non zero quantized transform coefficient.

9. The method of claim 6, wherein a next entropy encoder is selected when a current level exceeds a predetermined threshold.

10. A apparatus for adaptive entropy encoding/decoding of a plurality of quantized transform coefficients in a video compression system, wherein the plurality of quantized transform coefficients are scanned in a predetermined scanning order giving a generally decreasing average power and the plurality of quantized transform coefficients are stored in a memory unit, the apparatus comprising at least one of:

A) an encoding apparatus comprising:
- A1) a first memory unit, operably coupled to receive the plurality of quantized transform coefficients and to a parameter set determiner, for storing the quantized transform coefficients;
- A2) the parameter set determiner, operably coupled to the first memory unit, for parsing a predetermined number of quantized transform coefficients into a plurality of coefficient groups and converting the coefficient groups into a plurality of parameter sets according to a predetermined scheme and storing the parameter sets in the first memory unit, wherein each parameter set includes a level parameter which is a value of a non zero quantized transform coefficient, wherein, where a last coefficient group comprises all zero quantized transform coefficients, the last coefficient group is discarded;
- A3) an order reverser, operably coupled to the first memory unit, for accessing each parameter set of the plurality of parameter sets in reverse order of the predetermined scanning order and providing the parameter sets to an encoder controller and a plurality of entropy encoders;
- A4) the encoder controller, operably coupled to the order reverser, for choosing a current entropy encoder of the plurality of entropy encoders based on a previous level parameter of a previous parameter set; and
- A5) the plurality of entropy encoders, operably coupled to the encoder controller and the order reverser, for encoding a current parameter set to provide entropy encoded information bits; and B) a decoding apparatus comprising:
- B1) a plurality of entropy decoders, operably coupled to receive the entropy encoded information bits from the plurality of entropy encoders, for decoding the entropy encoded information bits to provide a decoded current parameter set;
- B2) a decoder controller, operably coupled to the plurality of entropy decoders, for adaptively selecting a next entropy decoder of the plurality of entropy decoders based on a decoded current level parameter of the decoded current parameter set and a previously selected entropy decoder;
- B3) a second memory unit, operably coupled to the plurality of entropy decoders, for storing each parameter set of a plurality of decoded parameter sets in the reverse of the predetermined scanning order; and
- B4) a parameter set converter, operably coupled to the second memory unit, for converting the decoded parameter sets into a number of decoded quantized transform coefficients according to the predetermined scheme in the predetermined scanning order and storing the decoded quantized transform coefficients in the second memory unit, wherein, where the number of decoded quantized transform coefficients is less than the predetermined number of quantized transform coefficients, zero-valued decoded quantized transform coefficients will be appended.

11. The apparatus of claim 10 wherein the predetermined scheme forms coefficient groups by grouping consecutive zero-valued quantized transform coefficients up to and including a non-zero quantized transform coefficient.

12. The apparatus of claim 10, wherein each parameter set further comprises a run parameter which is a number of zero-valued quantized transform coefficients prior to the non zero quantized transform coefficient.

13. The apparatus of claim 10, wherein each parameter set further comprises an end-of-block parameter which signifies a final parameter jet in the plurality of parameter sets to be encoded.

14. The apparatus of claim 10, wherein each entropy encoder is a variable length encoder.

15. The apparatus of claim 10, wherein each entropy encoder is an arithmetic encoder.

16. The apparatus of claim 10, wherein the plurality of entropy encoders are in a predetermined order.

17. The apparatus of claim 10, wherein the plurality of entropy encoders is two entropy encoders.

18. The apparatus of claim 16, wherein a next entropy encoder is chosen when a current level exceeds a predetermined threshold.

* * * * *